United States Patent
Lee et al.

(10) Patent No.: US 8,053,795 B2
(45) Date of Patent: Nov. 8, 2011

(54) LIGHT EMITTING DEVICE AND METHOD FOR FABRICATING THE SAME

(75) Inventors: Hyun Jae Lee, Yongin-si (KR); Jun Seok Ha, Seoul (KR)

(73) Assignee: LG Electronic Inc., Seoul (KR)

( * ) Notice: Subject to any disclaimer, the term of this patent is extended or adjusted under 35 U.S.C. 154(b) by 52 days.

(21) Appl. No.: 11/267,320

(22) Filed: Nov. 7, 2005

(65) Prior Publication Data

US 2006/0097274 A1    May 11, 2006

(30) Foreign Application Priority Data

Nov. 8, 2004   (KR) .................. 10-2004-0090456

(51) Int. Cl.
  *H01L 33/00*   (2010.01)
(52) U.S. Cl. .................................. 257/98; 257/79
(58) Field of Classification Search ............ 257/98, 257/79
  See application file for complete search history.

(56) References Cited

U.S. PATENT DOCUMENTS

| 6,172,382 B1 * | 1/2001 | Nagahama et al. | 257/94 |
| 6,657,237 B2 * | 12/2003 | Kwak et al. | 257/99 |
| 6,855,958 B2 * | 2/2005 | Sato et al. | 257/79 |
| 7,208,337 B2 * | 4/2007 | Eisert et al. | 438/42 |
| 2003/0189212 A1 | 10/2003 | Yoo | |
| 2006/0231852 A1 * | 10/2006 | Kususe et al. | 257/99 |

FOREIGN PATENT DOCUMENTS

| DE | 102 45 631 A1 | 4/2004 |
| EP | 1 385 215 A2 | 1/2004 |
| WO | WO 02/15286 A1 | 2/2002 |
| WO | WO 03/088318 A2 | 10/2003 |
| WO | WO 03/088320 | 10/2003 |
| WO | WO 2004/013916 A1 * | 2/2004 |
| WO | WO 2004/023569 | 3/2004 |
| WO | WO 2004/032247 A2 | 4/2004 |
| WO | WO2004322247 * | 4/2004 |

* cited by examiner

*Primary Examiner* — Quoc Hoang
*Assistant Examiner* — Tony Tran
(74) *Attorney, Agent, or Firm* — McKenna Long & Aldridge LLP

(57) ABSTRACT

A light emitting device and a method for fabricating the same according to the present invention are advantageous in that since an LLO (Laser Lift Off) process is performed using a thick metal film grown through a growth process, an occurrence rate of a void is remarkably decreased due to dense bonding between metals so that an occurrence rate of a crack can be decreased. Further, the present invention has an advantage in that a metal is filled in trench regions formed through an isolation process for devices, thereby protecting the devices and ensuring excellent heat dissipation. The present invention has a further advantage in that a reflective film is formed on inclined sidewalls of a device-forming thin film layer so that light loss through lateral sides of the device can be reduced, thereby improving optical properties.

9 Claims, 15 Drawing Sheets

LASER

LASER

LASER

LIGHT EMITTING DEVICE AND METHOD FOR FABRICATING THE SAME

This application claims priority to Korean Applications 10-2004-0090456 filed on Nov. 8, 2004, which is incorporated by reference, as if fully set forth herein.

BACKGROUND OF THE INVENTION

1. Field

The present invention relates to a light emitting device and a method for fabricating the same.

2. Description of the Related Art

Generally, sapphire ($Al_2O_3$) used for a substrate for growing gallium nitride (GaN) causes many problems in fabrication and driving of devices due to its own nonconductivity and low thermal conductivity in fabricating the devices using GaN.

To solve such problems, a device is fabricated by removing a sapphire substrate using an LLO (Laser Lift Off) method. In order to remove the sapphire substrate, a GaN thin film should be first bonded to a wafer made of silicone (Si), or gallium arsenide (GaAs), or a metal plate, which has high conductivity and superior thermal conductivity.

As described above, if a wafer or a metal plate is bonded to a GaAs thin film, chances are that a portion of the GaAs thin film is broken or several cracks are generated therein.

As one of the methods for reducing such break of the GaN thin film and propagation of the cracks, etching a portion of the GaN thin film and bonding it to the surface of sapphire has been widely used.

However, due to a step naturally produced after the etching, a void space is produced upon bonding of the GaN film. Accordingly, a process of filling such a void space with a variety of materials and subsequently performing a bonding process has been frequently used.

FIGS. 1a to 1e are sectional views schematically illustrating a conventional process of fabricating a GaN device. As shown in FIG. 1a, a thin film layer (11) including a plurality of devices each of which has an N-GaN layer, an active layer and a P—GaN layer is formed on a top surface of a sapphire substrate (10).

Here, the device is a device such as a light emitting diode.

Thereafter, the thin film layer (11) is selectively etched such that the plurality of devices (11a) are separated from each other (FIG. 1b).

At this time, due to the etching process, regions that have been etched between the devices (11a) become trenches (20) defined and enclosed by the devices (11a).

Next, a P metal layer (12) is formed on the top of each of the plurality of devices (11a) (FIG. 1c).

Successively, a carrier substrate (14) is bonded to the P metal layers (12) formed on each top of the plurality of devices (11a) using a bonding material (13) (FIG. 1d).

The carrier substrate (14) is made of one selected from the group consisting of silicone, GaAs, Cu and Al.

Then, the sapphire substrate (10) is separated by performing an LLO process (FIG. 1e).

Here, there arises a problem in that the trenches (20) are not filled with the bonding material (13) so that, as shown in FIG. 1e, a crack (25) is produced in the device due to the difference of a thermal expansion coefficient between GaN and air expanded by heat of laser incident for the LLO process.

FIGS. 2a to 2h are sectional views schematically illustrating another conventional process of fabricating a GaN device. A thin film layer (11) including a plurality of devices each having an N-GaN layer, an active layer and a P—GaN layer is formed on a top surface of a sapphire substrate (10) (FIG. 2a).

Here, the device is a device such as a light emitting diode.

Thereafter, the thin film layer (11) is selectively etched such that the plurality of devices (11a) are separated from each other, thereby making trenches (20) between the devices (11a) through the etching (FIG. 2b).

Next, a P metal layer (12) is formed on the top of each of the plurality of devices (11a), and the trenches (20) are filed with an easily removable material (30) (FIG. 2c).

Here, the easily removable material (30) is any one of epoxy, a photoresist, a polyimide and a dielectric.

Successively, a metallic bonding layer (33) is deposited on the P metal layer (12) formed on the top of each of the plurality of devices (11a), and another metallic bonding layer (34) is deposited on the bottom of a carrier substrate (35). Then, the P metal layers (12) and the carrier substrate (35) are bonded by means of bonding forces of the metallic bonding layers (33, 34) (FIG. 2d).

Here, a material such as AuSn with a melting point of about 350° C. is used for the metallic bonding layers (33, 34). The carrier substrate (35) is put on the top surfaces of the P metal layers (12), and the metallic bonding layers (33, 34) are then melted at a temperature higher than the melting point of the metallic bonding layers (33, 34) so that the P metal layers (12) and the carrier substrate (35) are bonded to each other.

Then, the sapphire substrate (10) is separated by performing an LLO process, and the material (30) filled in the trenches (20) is removed (FIG. 2e).

Thereafter, the plurality of devices (11a) and the trenches (20) are cleaned, and the plurality of devices (11a) are partially removed by performing an etching process (FIG. 2f).

Here, the removed regions of the plurality of devices (11a) are regions of the devices opposite to regions where the P metal layers (12) are formed.

Except for the portions of the top surfaces of the plurality of devices (11a) which have been partially removed, a passivation film (18) for enclosing the plurality of devices (11a) and filling the trenches (20) is formed, and N metal layers (15) are then formed on the portions of the top surfaces of the plurality of devices (11a) where the passivation film (18) has not been formed (FIG. 2g).

Subsequently, the plurality of devices (11a) are separated to pieces from each other by performing a scribing process and a breaking process (FIG. 2h).

FIGS. 3a to 3h are sectional views schematically illustrating a further conventional process of fabricating a GaN device. A thin film layer (11) including a plurality of devices each having an N-GaN layer, an active layer and a P—GaN layer is formed on the top surface of a sapphire substrate (10) (FIG. 3a).

Thereafter, the thin film layer (11) is selectively etched such that the plurality of devices (11a) are separated from each other, thereby forming trenches (20) between the devices (11a) through the etching (FIG. 3b).

Next, a P metal layer (12) is formed on the top of each of the plurality of devices (11a), and the trenches (20) are filled with an easily removable material (30) (FIG. 3c).

Here, the easily removable material (30) refers to such material as can be easily removed through an etching process.

The foregoing processes of FIGS. 3a to 3c are the same as those of FIGS. 2a to 2c.

Subsequently, a seed metal layer (40) is deposited on the tops of the filling material (30) and the P metal layers (12) formed on the plurality of devices (11a), and a metallic carrier layer (41) is then deposited on the seed metal layer (40) (FIG. 3d).

Then, the sapphire substrate (10) is separated by performing an LLO process, and the material (30) filled in the trenches (20) is removed (FIG. 3e).

Thereafter, the plurality of devices (11a) and the trenches (20) are cleaned, and the plurality of devices (11a) are partially removed by performing an etching process (FIG. 3f).

Here, the removed regions of the plurality of devices (11a) are regions of the devices opposite to regions where the P metal layers (12) are formed.

Except for the portions of the top surfaces of the plurality of devices (11a) which have been partially removed as such, a passivation film (18) for enclosing the plurality of devices (11a) and filling the trenches (20) is formed, and N metal layers (15) are then formed on the portions of the top surfaces of the plurality of devices (11a) where the passivation film (18) has not been formed (FIG. 3g).

Successively, the plurality of devices (11a) are separated to pieces from each other by performing a scribing process and a breaking process (FIG. 3h).

The aforementioned second method of FIGS. 2a to 2h and third method of FIGS. 3a to 3h are quite similar to each other in view of all the processes. As compared with the aforementioned first method, the trenches in the second and third methods are filled with an easily removable material, and metal layers are bonded to each other to ensure strong bonding, remarkably reducing the frequency of occurrence of fine voids that may be produced during the bonding. However, the problem of there being presence of a crack persists.

BRIEF SUMMARY OF THE INVENTION

The present invention is conceived to solve the aforementioned problems. Accordingly, it is an object of the present invention to provide a light emitting device and a method for fabricating the same, wherein since an LLO (Laser Lift Off) process is performed using a thick metal film grown through a growth process, an occurrence rate of a void is remarkably decreased due to dense bonding between metals so that an occurrence rate of a crack can be decreased.

It is another object of the present invention to provide a light emitting device and a method for fabricating the same, wherein a metal is filled in trench regions formed through an isolation process for devices, thereby protecting the devices and ensuring excellent heat dissipation.

It is a further object of the present invention to provide a light emitting device and a method for fabricating the same, wherein a reflective film is formed on inclined sidewalls of a device-forming thin film layer so that light loss through lateral surfaces of the device can be reduced, thereby improving optical properties.

According to a first aspect of the present invention for achieving the objects, there is provided a light emitting device, comprising: a device structure having inclined sidewalls and including an N-semiconductor layer, an active layer and a P-semiconductor layer; a P electrode pad layer formed on the device structure; a reflective metal film formed on the P electrode pad layer; a passivation layer enclosing the device structure, the P electrode pad layer, the reflective metal film and a portion of the top of the reflective metal film; a seed metal layer enclosing the passivation layer; a metal layer enclosing the seed metal layer and the reflective metal film; and an N electrode pad layer formed on the bottom of the device structure.

According to a second aspect of the present invention for achieving the objects, there is provided a light emitting device, comprising: a metal layer; a reflective metal film formed on the metal layer; a first electrode pad layer formed on the reflective metal film; a device-forming thin film formed on the first electrode pad layer and having an N-GaN layer, an active layer and a P—GaN layer; a second electrode pad layer formed on a portion of the top of the device-forming thin film; and a passivation layer enclosing the device-forming thin film and lateral sides of the second electrode pad layer.

According to a third aspect of the present invention for achieving the objects, there is provided a method of fabricating a light emitting device, comprising the steps of: forming a thin film layer including a plurality of devices each having an N-semiconductor layer, an active layer and a P-semiconductor layer on a top surface of a substrate; selectively etching the thin film layer such that the plurality of devices are isolated from one another and have sidewalls inclined at a predetermined angle with respect to the substrate; sequentially forming a P electrode pad layer and a reflective metal film on each of the plurality of devices; forming a passivation layer enclosing the devices, the P electrode pad layers, the reflective metal films and the top surface of the substrate excluding portions of the tops of the reflective metal films, and forming a seed metal layer on portions of the tops of the reflective metal films exposed through the passivation layer and on the passivation layer; depositing a metal layer on the seed metal layer; separating the substrate from the devices by performing an LLO (Laser Lift Off) process; partially etching and removing regions of the devices, passivation layer, seed metal layer and metal layer, which have been in contact with the substrate; forming an N electrode pad layer on the bottom of each of the devices; and separating the respective devices from one another by performing a cutting process.

According to a fourth aspect of the present invention for achieving the objects, there is provided a method of fabricating a light emitting device, comprising the steps of: forming a thin film layer including a plurality of devices each having an N-GaN layer, an active layer and a P—GaN layer on a top surface of a substrate; sequentially depositing a P metal layer, a reflective metal film and a metal layer on the thin film layer; separating the substrate from the thin film layer by performing an LLO (Laser Lift Off) process; selectively etching the thin film layer such that the plurality of devices are isolated from one another; forming an N metal layer on each of the plurality of devices and forming a passivation layer enclosing the plurality of devices; and separating the respective devices from one another by performing a cutting process.

BRIEF DESCRIPTION OF THE DRAWINGS

The above and other objects, features and advantages of the present invention will become apparent from the following descriptions of preferred embodiments given in conjunction with the accompanying drawings, in which.

DETAILED DESCRIPTION

Hereinafter, preferred embodiments of the present invention will be described in detail with reference to the accompanying drawings.

Figure 1A:
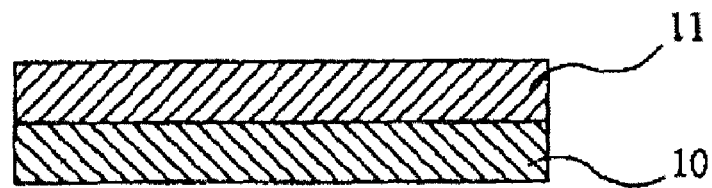
FIGS. 1a to 1e are sectional views schematically illustrating a conventional process of fabricating a GaN device.
Figure 1B:
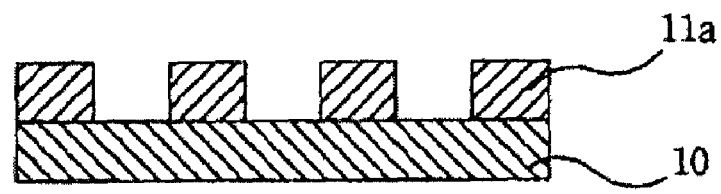
Figure 1C:
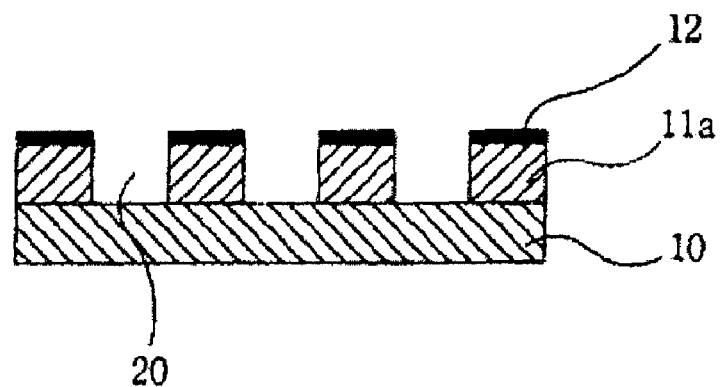
Figure 1D:
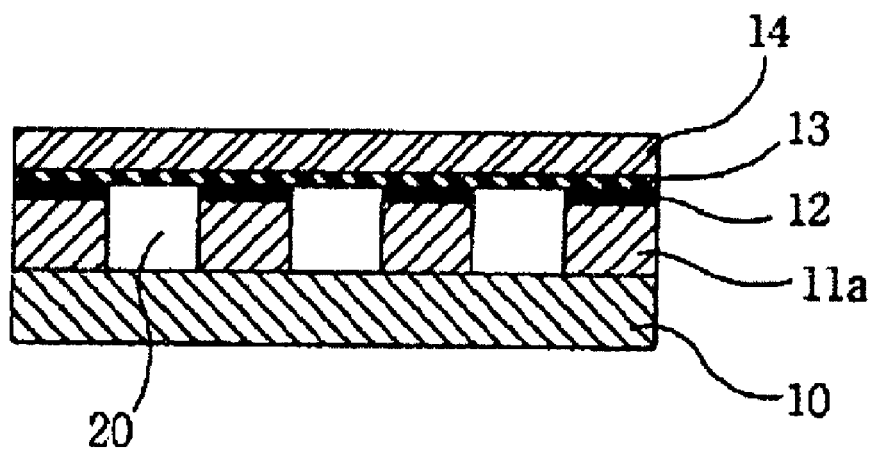
Figure 1E:
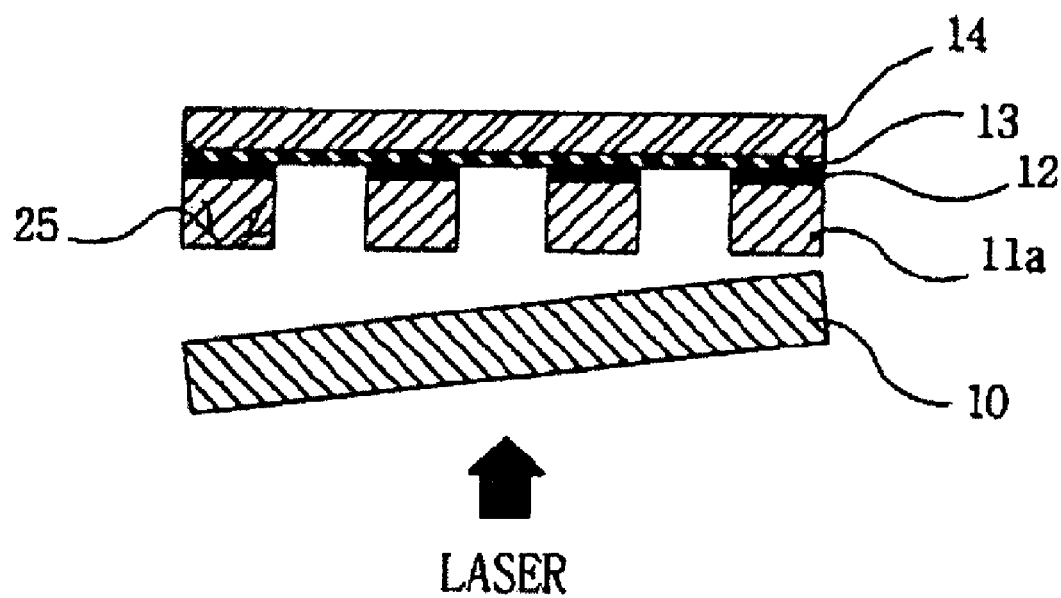
Figure 2A:
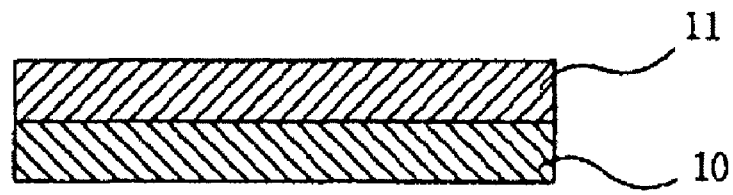
FIGS. 2a to 2h are sectional views schematically illustrating another conventional process of fabricating a GaN device.
Figure 2B:
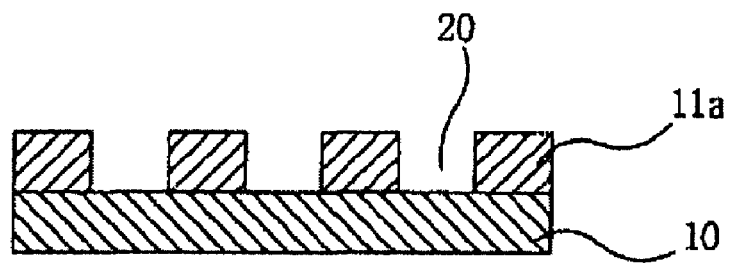
Figure 2C:
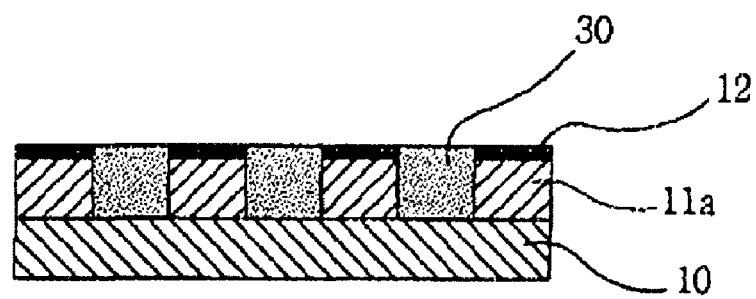
Figure 2D:
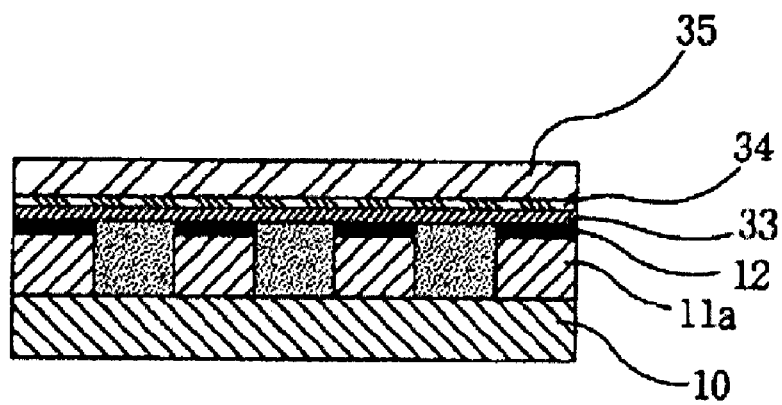
Figure 2E:
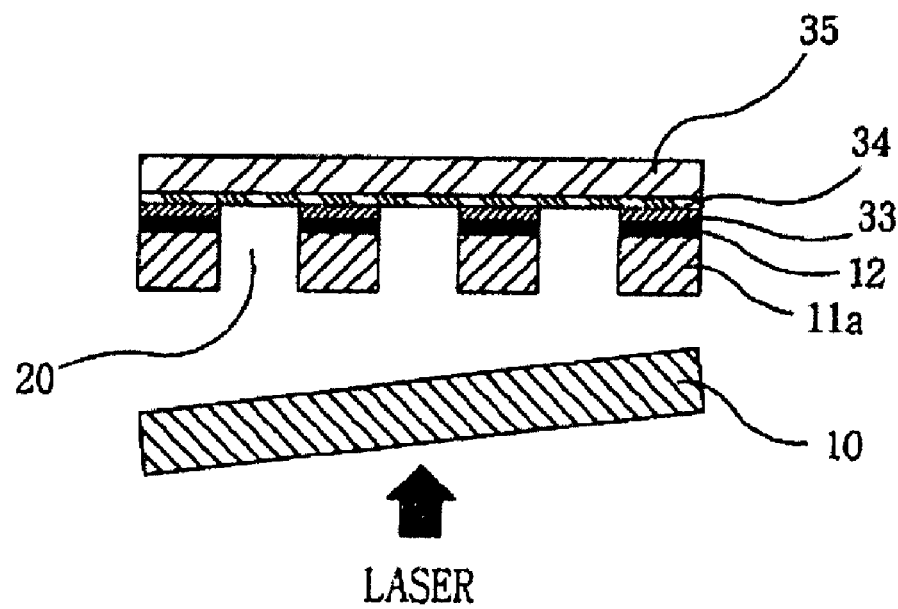
Figure 2F:
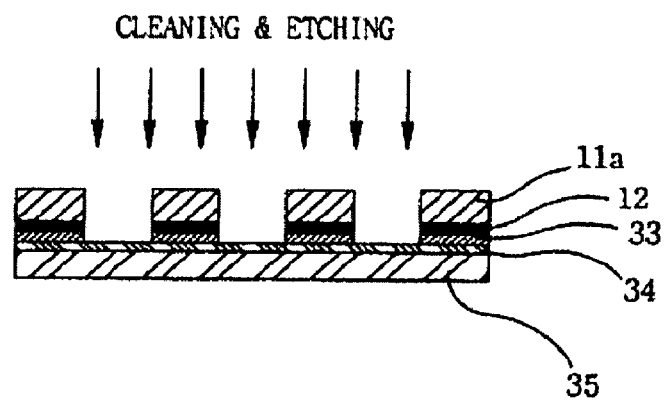
Figure 2G:
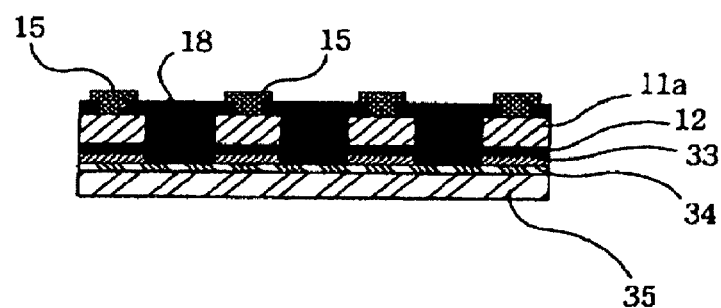
Figure 2H:
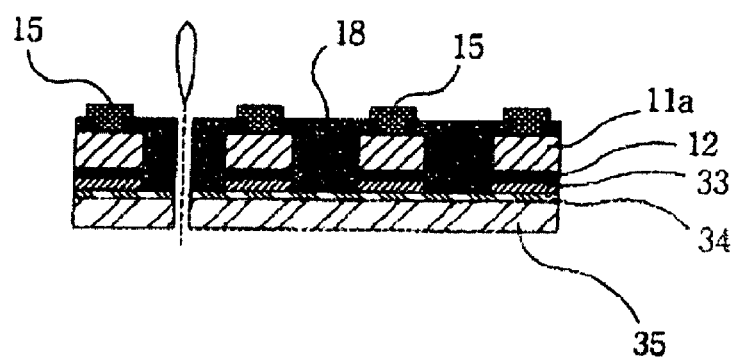
Figure 3A:
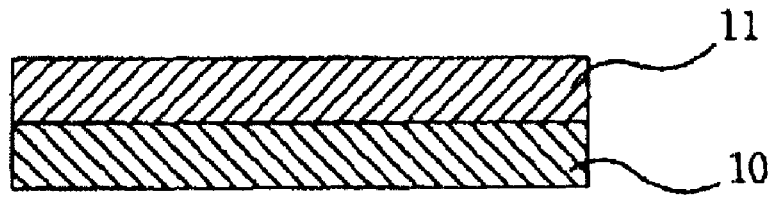
FIGS. 3a to 3h are sectional views schematically illustrating a further conventional process of fabricating a GaN device.
Figure 3B:
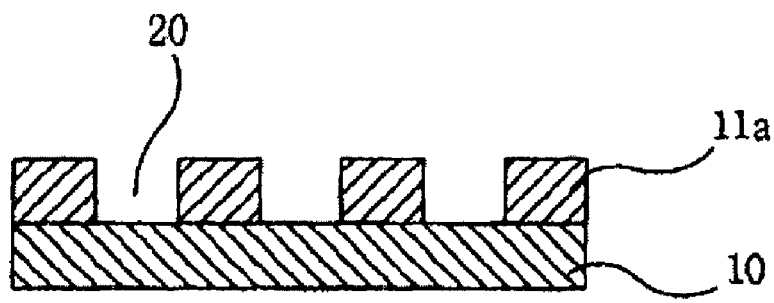
Figure 3C:
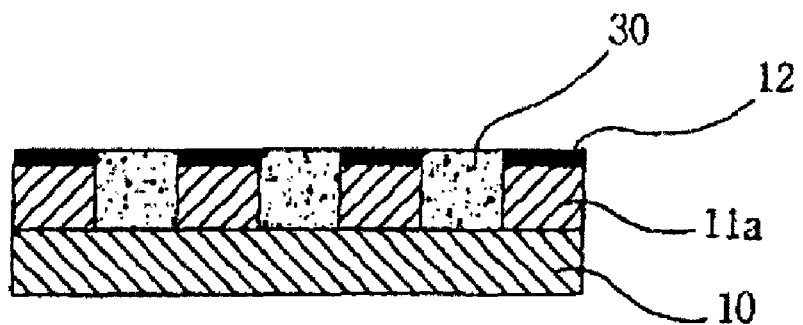
Figure 3D:
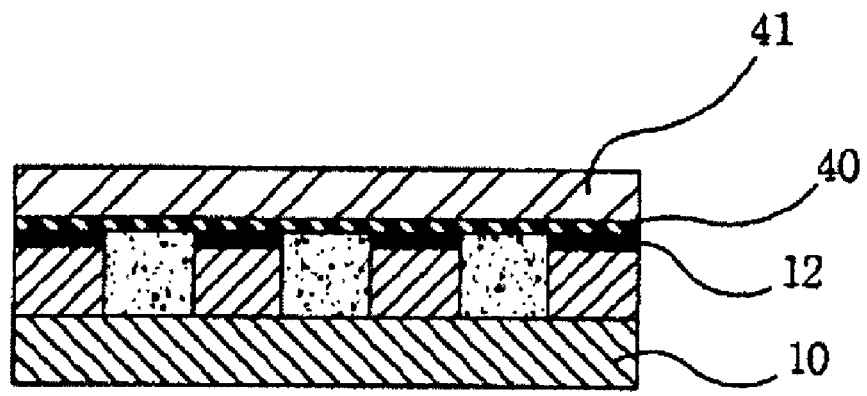
Figure 3E:
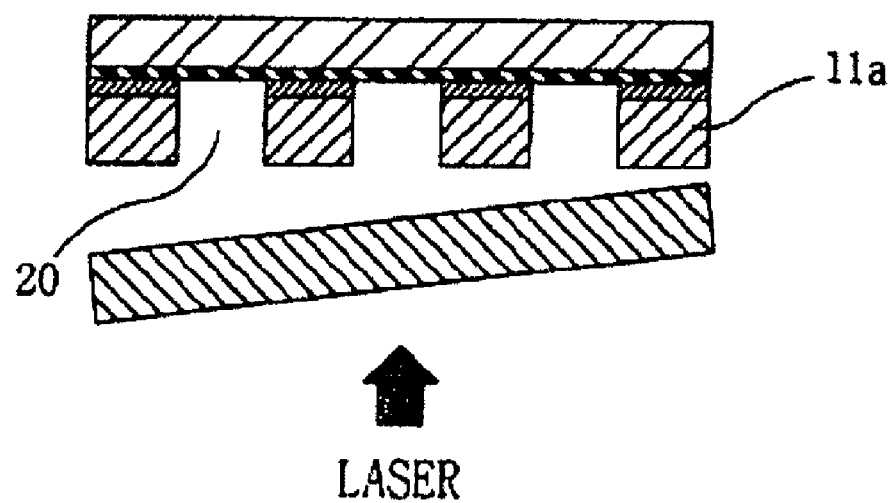
Figure 3F:
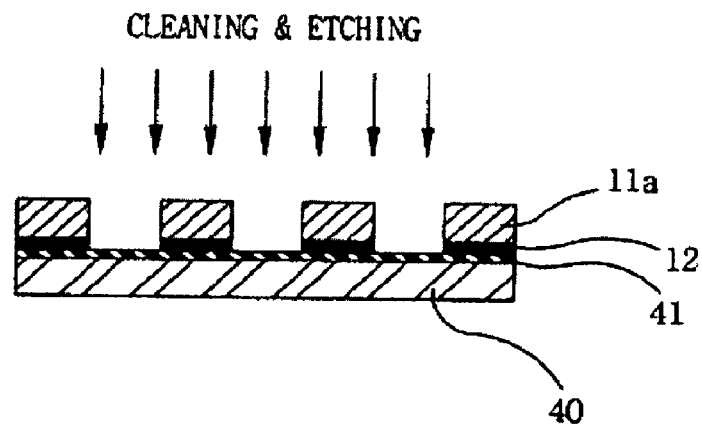
Figure 3G:
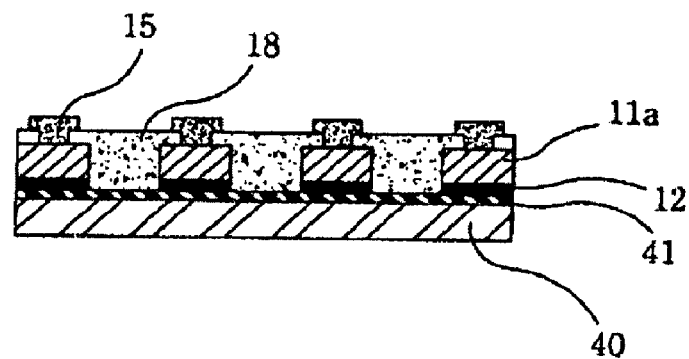
Figure 3H:
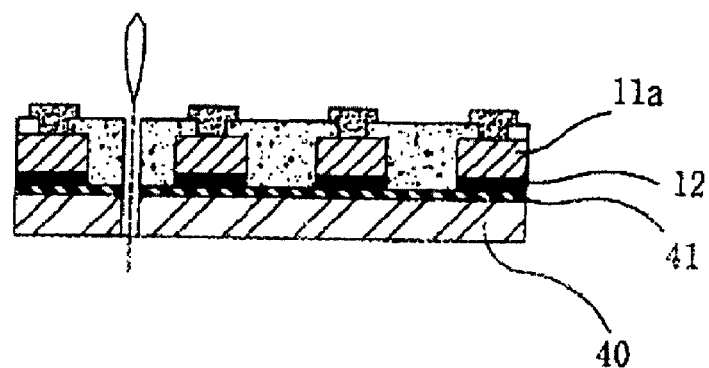
Figure 4A:
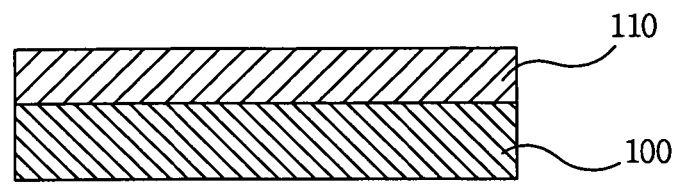
FIGS. 4a to 4i are sectional views schematically illustrating a process of fabricating a light emitting device according to a first embodiment of the present invention.

FIGS. 4a to 4i are sectional views schematically illustrating a process of fabricating a light emitting device according to a first embodiment of the present invention. A thin film layer (110) including a plurality of devices each of which has an N-GaN layer, an active layer and a P—GaN layer is formed on a top surface of a sapphire substrate (100) (FIG. 4a).

Here, the thin film layer (110) has the same structure as that of a light emitting device with an N-GaN layer, an active layer and a P—GaN layer sequentially laminated one over the other.

Further, the thin film layer (110) including the plurality of devices each of which has the N-GaN layer, the active layer and the P—GaN layer may be formed on a substrate made of another material as well as the sapphire substrate (100).

Figure 4B:
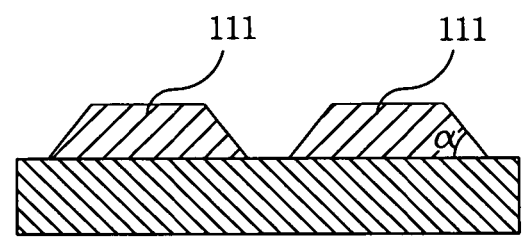

Then, as shown in FIG. 4b, the thin film layer (110) is selectively etched such that the plurality of devices (111) are isolated from one another and have sidewalls each inclined at a predetermined angle ($\alpha$) with respect to the sapphire substrate (100) (FIG. 4b).

Through the isolation process of FIG. 4b, the plurality of devices (111) are isolated from one another, and the etched regions become entrenched.

Preferably, the angle ($\alpha$) is in the range of 45 to 65 degrees.

An inclined cleavage plane of such a device facilitates growth of a material film compared with a vertical cleavage plane.

Further, if a reflective film is formed on an inclined etched surface of the device even the optical point of views, the reflective film is formed along the etched surface so that an inclined reflective film can be implemented.

Therefore, a light emitted from the device is reflected on the reflective film and then emerges toward above the device.

Accordingly, optical properties can be improved since the present invention can reduce light loss in a lateral direction.

That is, as shown in FIG. 4b, it is preferred that the device has a structure in which the width of the N-semiconductor layer is larger than that of the P-semiconductor layer.

Figure 4C:
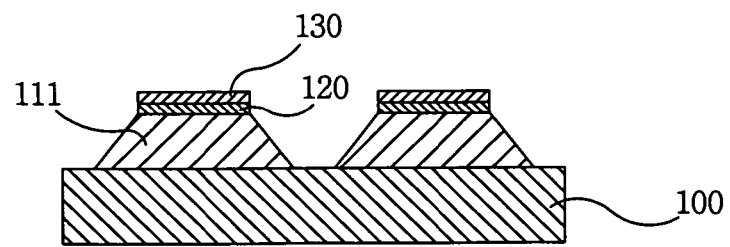

Subsequently, a P electrode pad layer (120) and a reflective metal film (130) are sequentially formed on each the plurality of devices (111) (FIG. 4c).

Here, the P electrode pad layer (120) is formed on the top of the P—GaN layer of the thin film layer (110).

At this time, to ensure an ohmic contact, the P electrode pad layer (120) is made of any one selected from the group consisting of Ni/Au, Ru/Au, ITO, Pd/Au and Pd/Ni.

Here, the Ni/Au refers to an electrode pad with an Ni layer and an Au layer sequentially laminated one over the other.

Further, the reflective metal film (130) is formed out of an alloy including at least one of Al, Ag, Au, Cu and Rh.

Figure 4D:
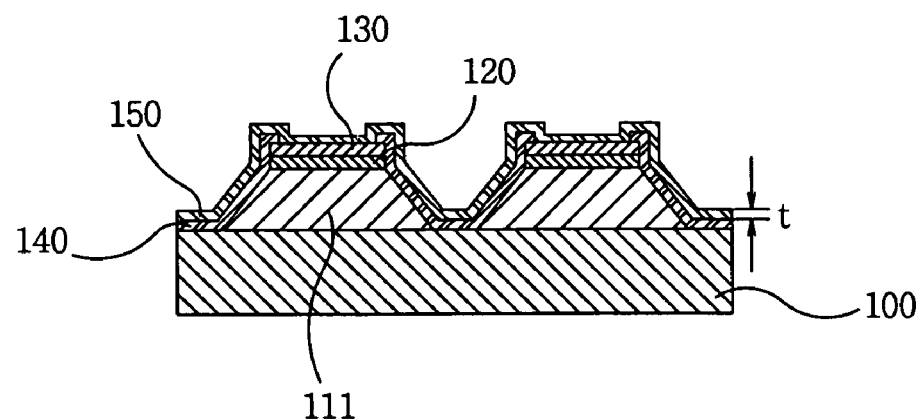

Next, except for portions of the tops of the reflective metal films (130), a passivation layer (140) is formed to enclose the devices (111), the P electrode pads (120), the reflective metal films (130) and the top surface of the sapphire substrate (100), and a seed metal layer (150) is formed on the portions of the tops of the reflective metal films (130) exposed through the passivation layer (140) and on the passivation layer (140) (FIG. 4d).

Here, the passivation layer (140) is formed out of $SiO_2$ or $Si_3N_4$, or a film of an HR (High Reflective) material such as $TiO_2$, SiN, $Al_2O_3$, $Ta_2O_3$ or the like.

Passivation with the HR film not only protects the devices but also reflects light while simultaneously insulating the devices, thereby reducing light loss in the optical devices.

Further, the seed metal layer (150) is made of any one of Ta, TiW, TaW, Cu, Al, Ti, Pt, Au and Cr.

Furthermore, the seed metal layer (150) is grown to have a thickness (t) of 30 to 300 µm that is relatively thicker than those of other metal layers, in order to protect separated devices from stress generated during an LLO process and to facilitate heat dissipation.

Figure 4E:
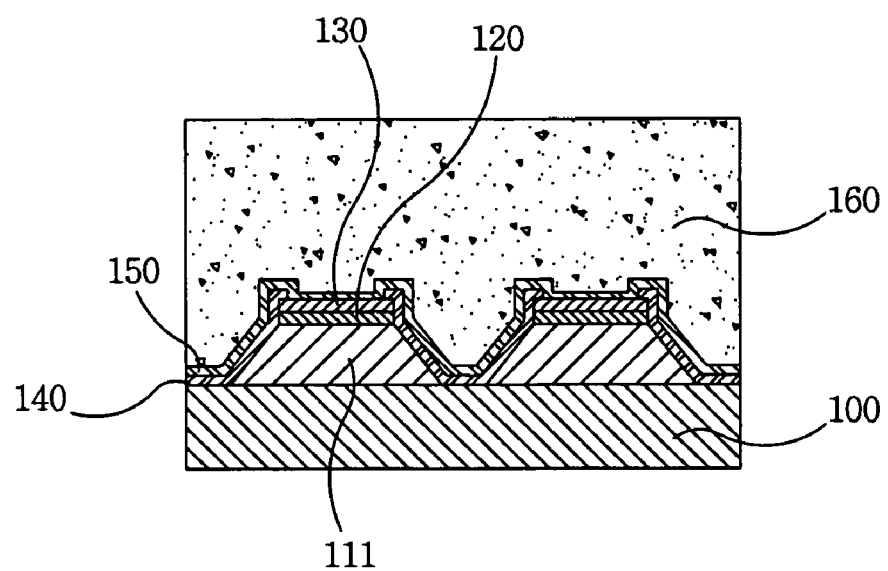

Then, a metal layer (160) is deposited on the seed metal layer (150) (FIG. 4e).

Figure 4F:
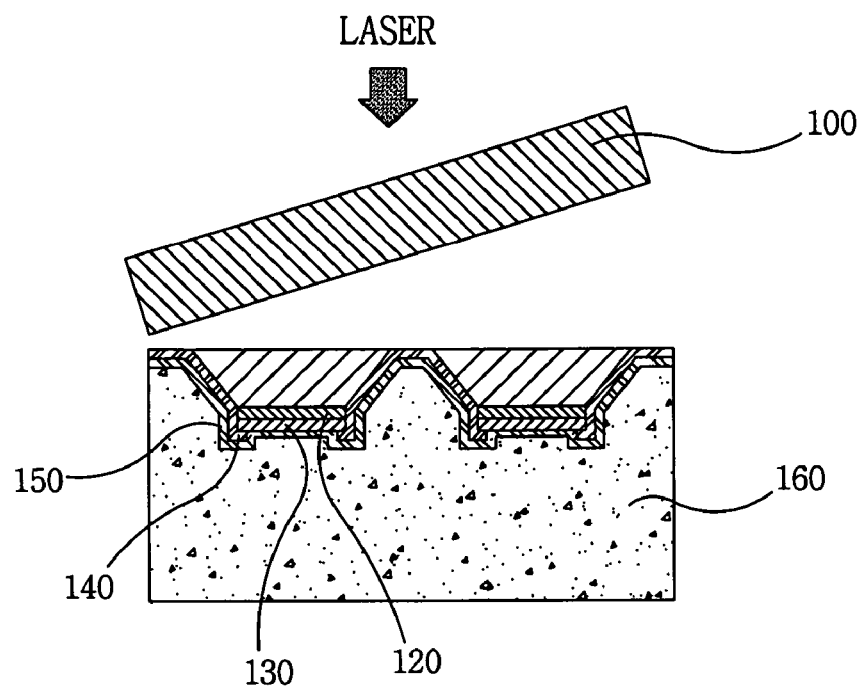

Next, the sapphire substrate (100) is separated from the devices by performing an LLO process (FIG. 4f).

Consequently, during the process of FIG. 4f, the metal layer (160) is filled in depressed regions, i.e., trench regions, existing between the respective devices.

Figure 4G:
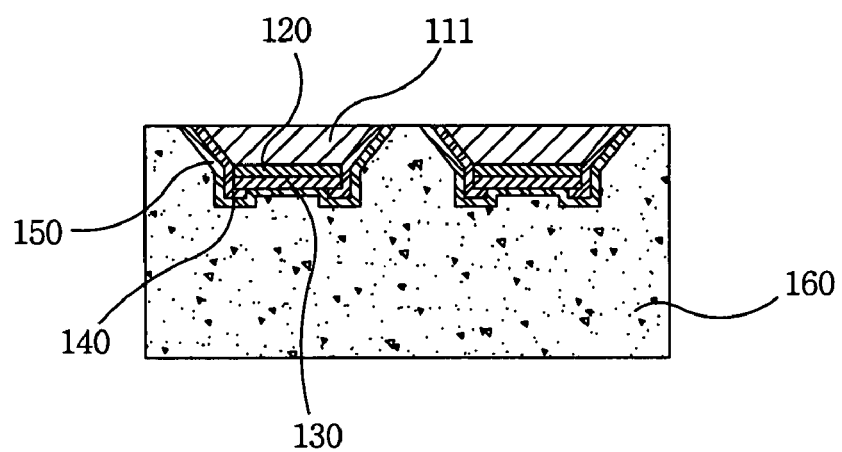

Subsequently, regions of the devices (111), passivation layer (140), seed metal layer (150) and metal layer (160), which have been in contact with the sapphire substrate (100), are etched and partially removed. (FIG. 4g).

Figure 4H:
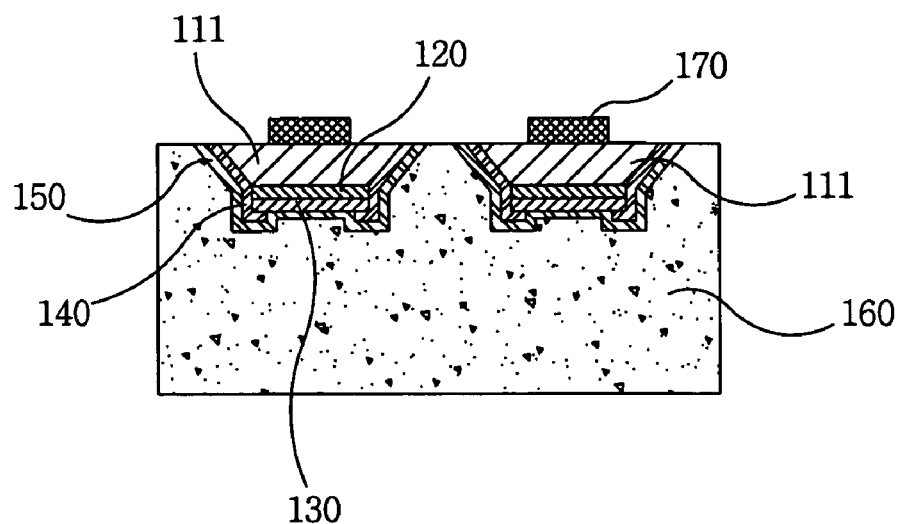

Then, an N electrode pad layer.(170) is formed on each of the devices (111) (FIG. 4h).

Figure 4I:
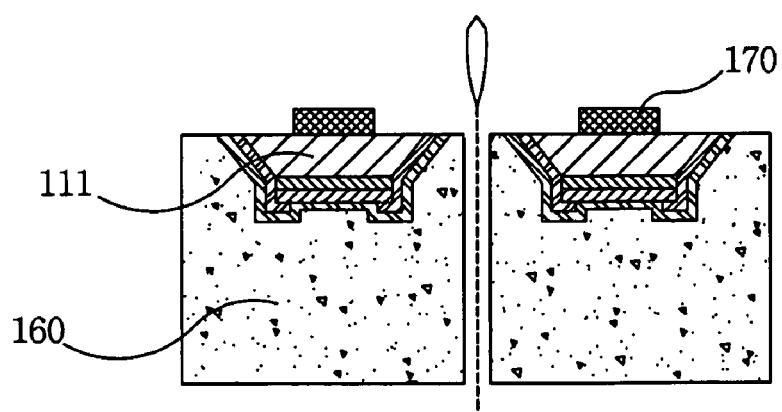

Finally, the respective devices (111) are separated from one another by performing a cutting process such as a scribing process and a breaking process (FIG. 4i).

Figure 5:
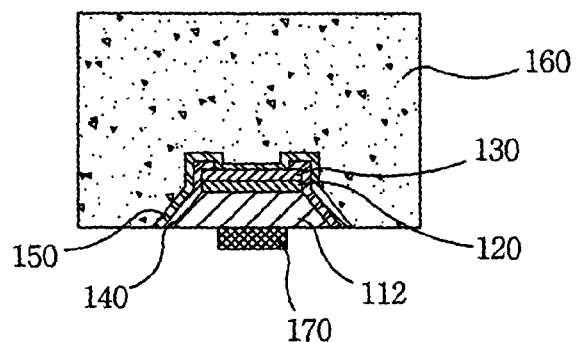
FIG. 5 is a sectional view of a light emitting device fabricated according to the first embodiment of the present invention.

As shown in FIG. 5, a light emitting device fabricated according to the first embodiment of the present invention by performing the aforementioned processes comprises: a device structure (112) having inclined sidewalls and including an N-semiconductor layer, an active layer and a P-semiconductor layer; a P electrode pad layer (120) formed on the device structure (112); a reflective metal film (130) formed on the P electrode pad layer (120); a passivation layer (140) enclosing the device structure (112), the P electrode pad layer (120), the reflective metal film (130) and a portion of the top of the reflective metal film (130); a seed metal layer (150) enclosing the passivation layer (140); a metal layer (160) enclosing the seed metal layer (150) and the reflective metal film (130); and an N electrode pad layer (170) formed on the bottom of the device structure (112).

Preferably, the semiconductor layer is a gallium nitride (GaN) layer.

Further, it is preferred that the passivation layer (140) be formed to have a predetermined thickness from lateral sides of the device structure, P electrode pad layer and reflective metal film.

Figure 6A:
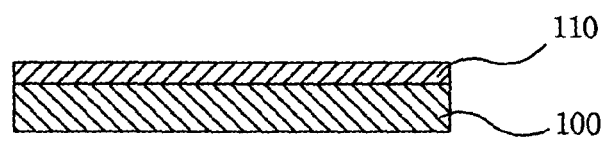
FIGS. 6a to 6f are sectional views schematically illustrating a process of fabricating a light emitting device according to a second embodiment of the present invention.

FIGS. 6a to 6f are sectional views schematically illustrating a process of fabricating a light emitting device according to a second embodiment of the present invention. A thin film layer (110) including a plurality of devices each having an N-GaN layer, an active layer and a P—GaN layer is formed on the top surface of a sapphire substrate (100) (FIG. 6a).

Figure 6B:
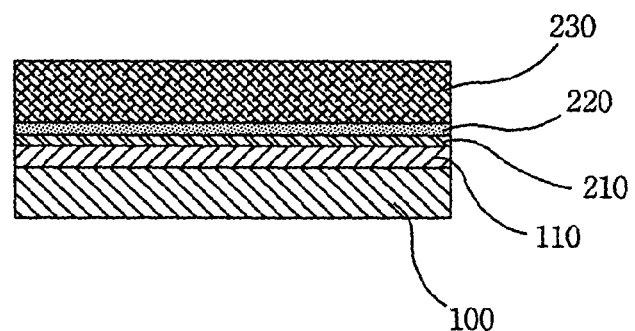

Thereafter, a P metal layer (210) as a P electrode pad layer, a reflective metal film (220) and a metal layer (230) are sequentially deposited on the thin film layer (110) (FIG. 6b).

Figure 6C:
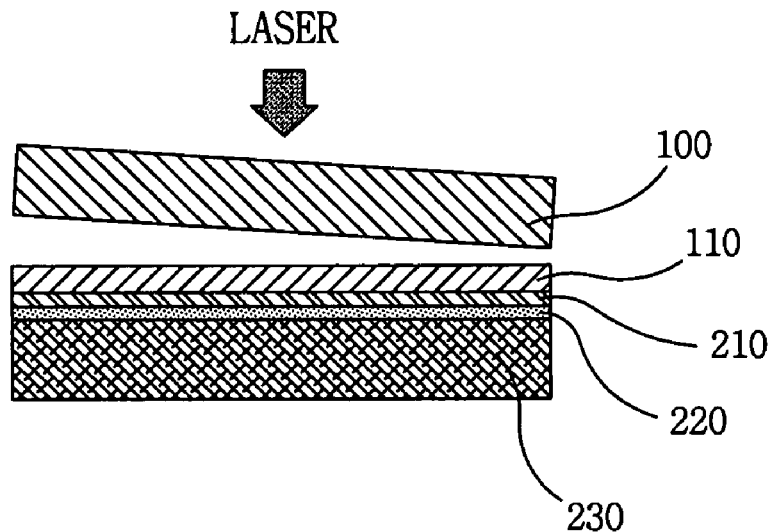

Subsequently, the sapphire substrate (100) is separated from the thin film layer (110) by performing an LLO process (FIG. 6c).

Figure 6D:
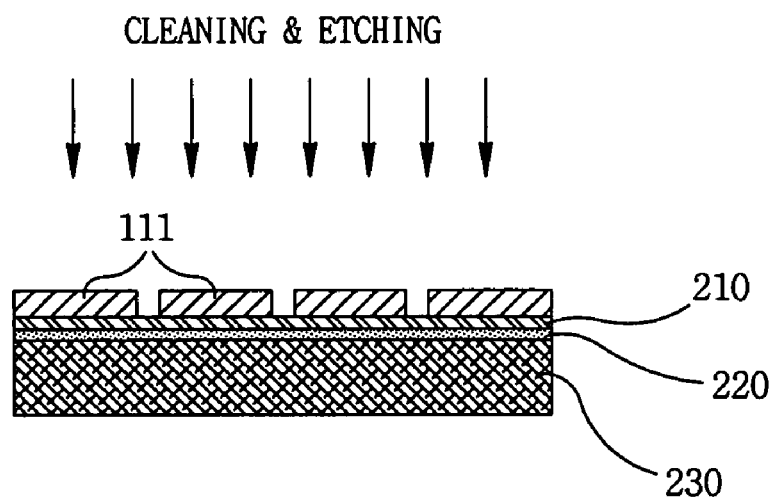

Then, the thin film layer (110) is selectively etched such that the plurality of devices (111) are isolated from one another (FIG. 6d).

At this time, it is preferred that a cleaning process be performed between the processes of FIGS. 6c and 6d.

Figure 6E:
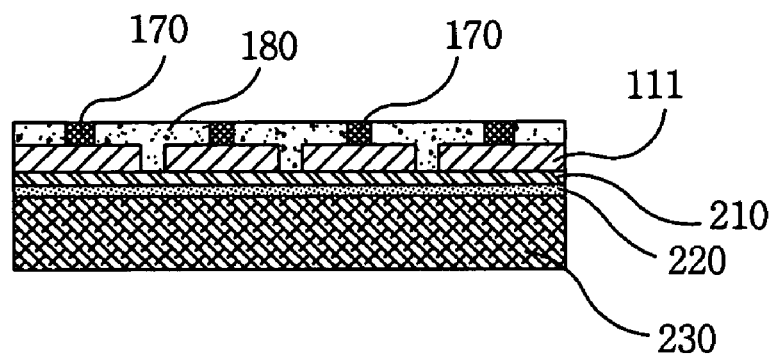

Then, an N metal layer (170) as an N electrode pad layer is formed on each of the plurality of devices (111), and a passivation layer (180) enclosing the plurality of devices (111) is formed (FIG. 6e).

Here, the passivation layer (180) is formed on exposed regions excluding the N metal layer (170), and the N metal layer (170) is exposed through the passivation layer (180).

Figure 6F:
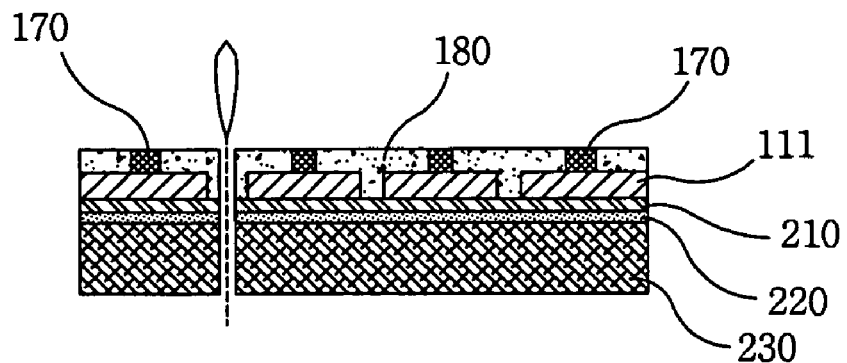

Finally, the respective devices (111) are separated from one another by performing a scribing process and a breaking process (FIG. 6f).

Therefore, a light emitting device fabricated according to the second embodiment of the present invention by performing the aforementioned processes comprises: a metal layer (230); a reflective metal film (220) formed on the metal layer (230); a first electrode pad layer (210) formed on the reflective metal film (220); a device-forming thin film (111) formed on the first electrode pad layer with an N-GaN layer, an active layer and a P—GaN layer; a second electrode pad layer (170) formed a portion of the top of the device-forming thin film; and a passivation layer (180) enclosing the device-forming thin film and lateral sides of the second electrode pad layer.

As described above, the light emitting device of the present invention has advantages as follows.

1) A metal is filled in trench regions formed through an isolation process for devices, so that the devices can be protected and have superior heat dissipation to that of the conventional methods.

2) Since an LLO (Laser Lift Off) process is performed using a thick metal film grown through a growth process rather than bonding of two heterogeneous substrates, an occurrence rate of a void is remarkably decreased due to dense bonding between metals, thereby lowering an occurrence rate of a crack.

3) Sidewalls of a thin film layer of a device are formed to be inclined during a device isolation process so that an additional material can easily grow on the sidewalls of the thin film layer of the device and light loss can be remarkably reduced due to an inclined cleavage plane of the thin film layer of the device.

4) Overall process can be simplified since a bonding process is not additionally required.

5) Overall process can be simplified since there is no need for filling an etched region between devices with another material.

As apparent from the foregoing, the present invention has an advantage in that a metal is filled in trench regions formed through an isolation process for devices, so that the devices can be protected and excellent heat dissipation can be ensured.

Further, the present invention has an advantage in that a reflective film is formed on inclined sidewalls of a device-forming thin film layer so that light loss through lateral surfaces of a device can be reduced to improve optical properties.

Although the present invention has been described and illustrated in connection with the preferred embodiments of the present invention, it is not limited thereto. It will be apparent to those skilled in the art that various modifications and changes can be made thereto without departing from the technical scope and spirit of the present invention. Therefore, it is obvious that such modifications and changes fall within the scope of the present invention defined by the appended claims.

What is claimed is:

1. A light emitting device, comprising:
a device structure comprising a first semiconductor layer, an active layer and a second semiconductor layer, wherein the device structure has inclined sidewalls;
a first electrode formed over the second semiconductor layer;
a passivation layer covering the inclined sidewalls and at least a portion of the first electrode;
a second electrode contacting a surface of the device structure;
a first metal layer formed on the first electrode wherein the passivation layer is arranged on the first metal layer;
a reflective metal film interposed between the first electrode and the first metal layer, wherein each of the reflective metal and the first electrode has the same area without a significant difference;
a second metal layer supporting the first semiconductor layer, the active layer and the second semiconductor layer, the first electrode and the first metal layer, wherein a portion of the first metal layer extends to at least the surface of the device structure; and
Wherein each inclination angle of the sidewalls is substantially in the range of 45 to 65 degrees.

2. The light emitting device as claimed in claim 1, wherein the first electrode comprises at least one or more selected from a group consisting of Ni, Au, Ru, ITO and Pd.

3. The light emitting device as claimed in claim 1, wherein the first electrode comprises a reflective metal film.

4. The light emitting device as claimed in claim 1, wherein a width of the first semiconductor layer is greater than that of the second semiconductor layer.

5. The light emitting device as claimed in claim 1, wherein the passivation layer comprises one of $SiO_2$, $Si_3N_4$, $TiO_2$, SiN, $Al_2O_3$ and $Ta_2O_3$.

6. The light emitting device as claimed in claim 1, wherein the passivation layer is configured to have a uniform thickness.

7. The light emitting device as claimed in claim 1, wherein a thickness of the first metal layer is substantially in the range of 30 to 300 um.

8. The light emitting device as claimed in claim 3, wherein the reflective metal film comprises at least one or more selected from a group consisting of Al, Au, Cu and Rh.

9. The light emitting device as claimed in claim 1, wherein the second electrode is directly formed on the first semiconductor layer.

* * * * *